United States Patent [19]

de Leeuwe

[11] Patent Number: 4,646,784

[45] Date of Patent: Mar. 3, 1987

[54] LIQUID CHEMICAL DISPENSING APPARATUS

[75] Inventor: Marc de Leeuwe, Aptos, Calif.

[73] Assignee: Union Carbide Corporation, Danbury, Conn.

[21] Appl. No.: 799,476

[22] Filed: Nov. 19, 1985

Related U.S. Application Data

[63] Continuation of Ser. No. 712,647, Mar. 18, 1985, abandoned, which is a continuation of Ser. No. 497,188, May 23, 1983, abandoned.

[51] Int. Cl.$^4$ .............................................. E03B 11/00
[52] U.S. Cl. ..................................... 137/565; 137/266; 137/589; 118/52; 222/58; 427/240

[58] Field of Search ............... 137/565, 588, 589, 255, 137/266, 559; 118/52-54; 427/240, 320; 222/58

[56] References Cited

U.S. PATENT DOCUMENTS

| | | | |
|---|---|---|---|
| 2,440,262 | 4/1948 | Grey et al. | 137/255 |
| 3,131,270 | 5/1964 | Ludwig et al. | 137/255 |
| 4,142,545 | 3/1979 | Billigmeier | 137/588 |
| 4,188,967 | 2/1980 | Joyce | 137/266 |
| 4,197,000 | 4/1980 | Blackwood | 118/52 |
| 4,325,320 | 4/1982 | Kirisawa | 427/240 |

*Primary Examiner*—A. Michael Chambers
*Attorney, Agent, or Firm*—Eugene Lieberstein

[57] ABSTRACT

Apparatus for dispensing liquid chemicals such as photoresist from containers, in particular, from collapsible pouch-type containers.

2 Claims, 4 Drawing Figures

LIQUID CHEMICAL DISPENSING APPARATUS

This application is a continuation of 06/712,647, filed 03/18/85 now abandoned, which is a continuation of 06/497,188 filed 05/23/83 now abandoned.

The present invention relates to the dispensing of liquid chemicals such as photoresist, a modified phenolic solution, from collapsible pouch-type containers.

In the course of the manufacture of microcircuits, it is a common and well known practice to coat wafers of silicon with liquid photoresist and this is usually done by continuously pumping the liquid photoresist from its container to the production component through which the wafers are passed to receive a coating of photoresist. It is important that the pumping of photoresist be continuous so that the processing of wafers is not interrupted.

It is an object of the present invention to provide an apparatus which enables the continuous pumping of photoresist from a succession of photoresist containers.

Other objects will be apparent from the following description and claims taken in conjunction with the drawing wherein:

Figure 1:
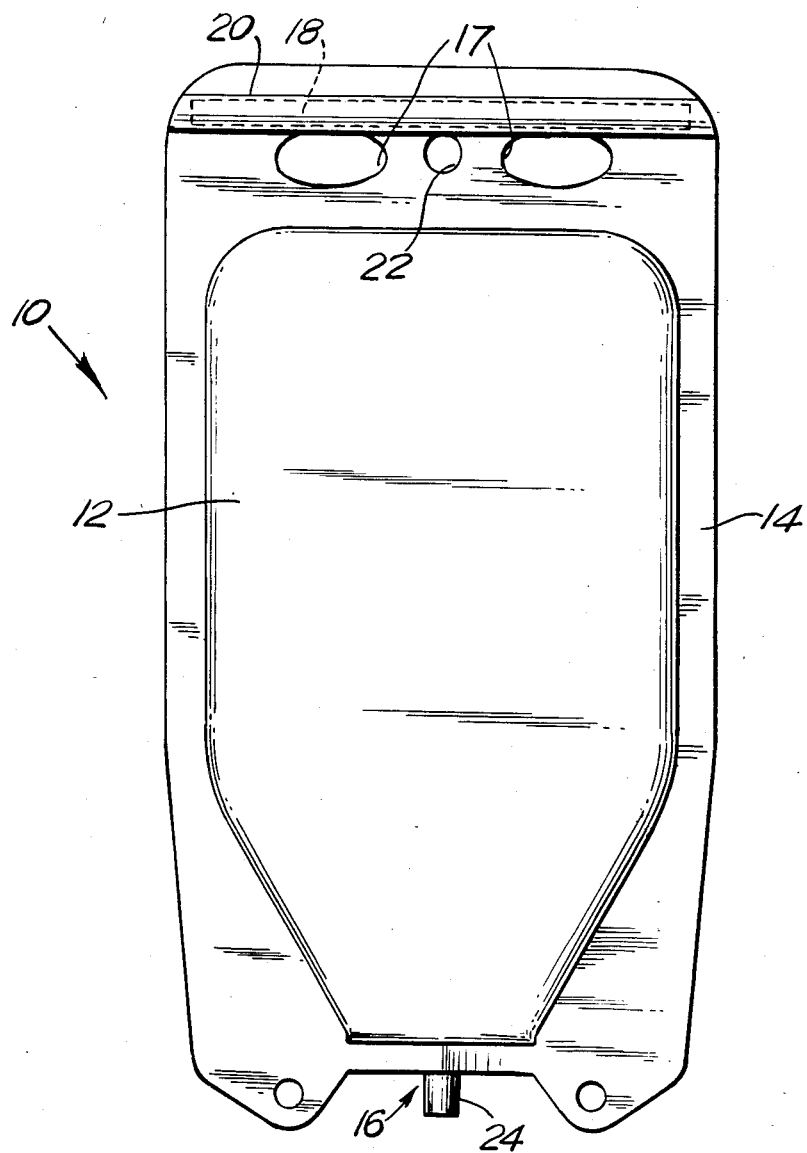
FIG. 1 shows a chemical container suitable for use in the present invention.

With reference to FIG. 1, a pouch-type container for liquid chemicals, such as photoresist, is shown at 10 and comprises a flexible, collapsible pouch 12 suitably formed of plastic laminate sheets of polyethylene and nylon as described in co-pending application Ser. No. 497,229, filed May 23, 1983, now U.S. Pat. No. 4,484,351. The laminate sheets are heat-sealed to provide a rim 14 and a fill/drain assembly 16 is sealed to the pouch 12. In handling, the pouch is carried at gripping aperatures 16 with support being provided by rod 18 in sleeve 20. When it is desired to use pouch 10 as a source of liquid chemical, e.g., photoresist, the pouch 10 is engaged with a hook through aperature 22 and outlet tube 24 is connected to the photoresist pumping system.

Figure 2:
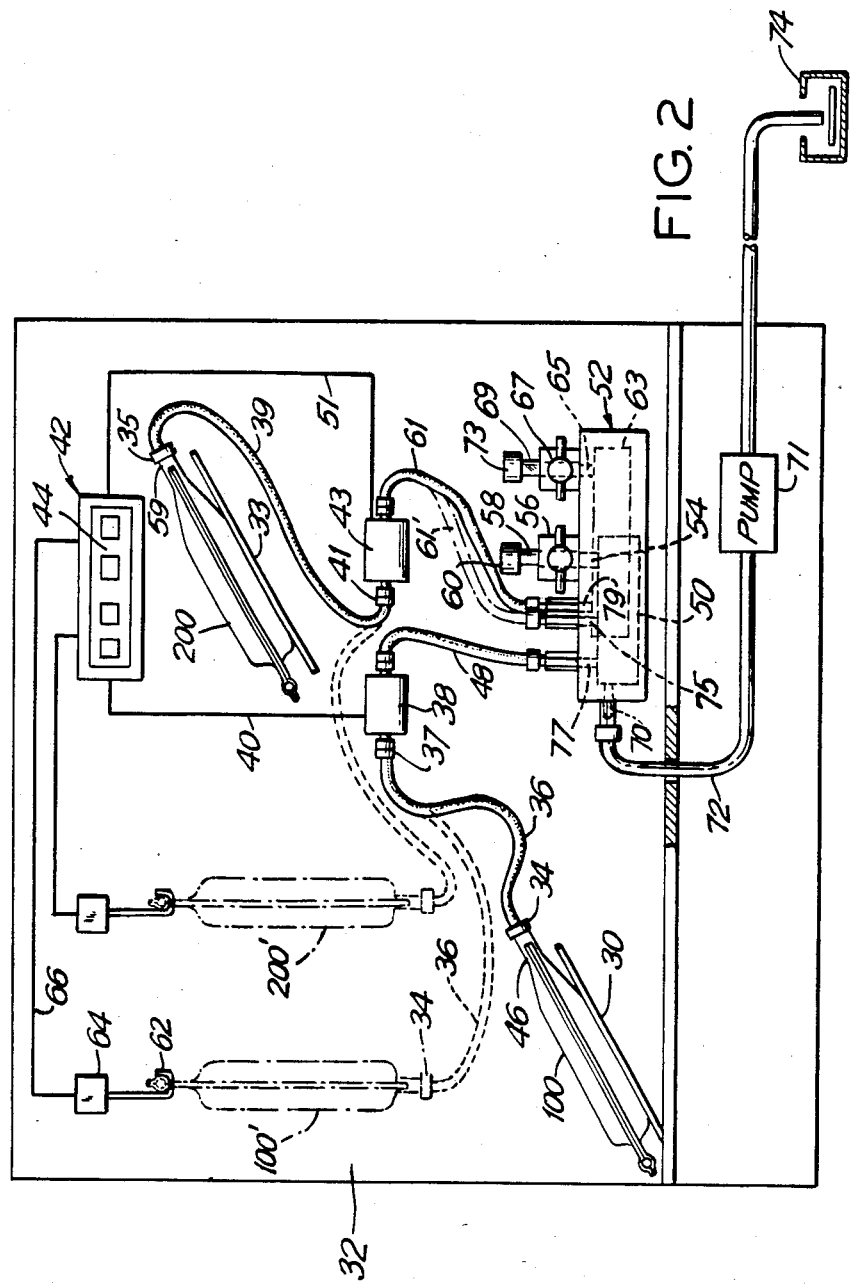
FIG. 2 shows the apparatus of the present invention in conjunction with containers of the type shown in FIG. 1 and, FIGS. 3a and 3b show the present invention in more complete detail.
Figure 3A:
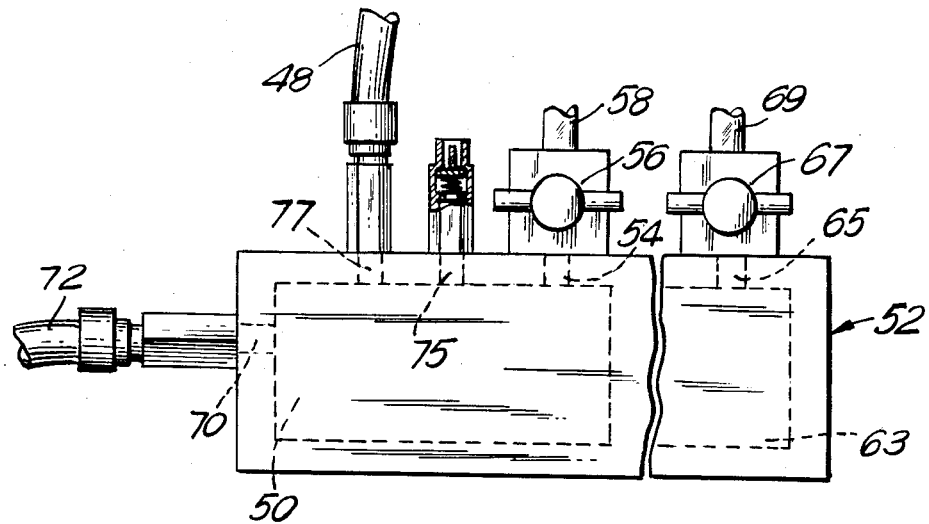
Figure 3B:
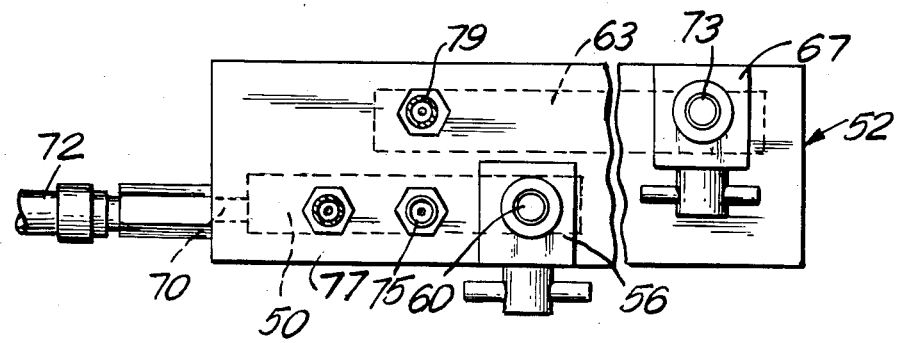

FIG. 2 illustrates the apparatus of the present invention with a filled pouch-type container 100 resting on a sloped shelf 30 of a panel 32, e.g., made of sheet metal. Pouch 100 communicates through connector 34, plastic tube 36 and connector 37 to a solenoid controlled valve 38 which is electrically connected via line 40 to control unit 42. An operator by pressing an appropriate switch on panel 44 causes the valve associated with solenoid 38 to open. A slight pressure is then applied to pouch 100 and any gas in the pouch 10, which is present at location 46, on account of the incline of pouch 10, is forced by liquid from pouch 10 through tube 36, valve 38 and tube 48 into chamber 50 of manifold bleeder block 52 which is suitably made from polyethylene but can be made of other materials appropriate for the liquid chemical being handled as is known to those skilled in the art. Pressure is maintained on pouch 100 to cause liquid photoresist to fill chamber 50 and force any gas through conduit 54 and through open hand-operated valve 56. When liquid appears in transparent tube 58, valve 56 is closed and the gas is thus removed. Excess liquid passes to receptacle 60 from which it can be recovered for disposal. Pouch 100 is now moved to the position indicated at 100 and is supported on a hook 62 which is engaged to a conventional electrically operated weight detector 64 which provides an electrical signal via line 66 to control unit 42 which indicates when pouch 100 is empty. Outlet 70 of bleeder block 52 is now connected to pump 70 via tube 72 and liquid photoresist is pumped continuously from pouch 100 to wafer processing unit 74.

While pouch 100 is being used to supply photoresist, a second pouch 200 on sloped shelf 33 communicates through connector 35, tube 39 and connector 41 to solenoid controlled valve 43 which is electrically connected via line 51 to control unit 42. The operator, by pressing an appropriate switch on panel 44 causes the valve associated with solenoid 43 to open. A light pressure is then applied to pouch 200 and any gas in pouch 200 which is present at location 59 is forced by liquid from pouch 200 through tube 61 into chamber 63 of manifold bleeder block 52. Pressure is maintained on pouch 200 to cause liquid photoresist to fill chamber 63 and force any gas through conduit 65 and through hand-operated valve 67. When liquid appears in transparent tube 69, valve 67 is closed and the gas is thus removed. Excess liquid passes to receptacle 70 where it can be recovered for disposal. Solenoid valve 43 is actuated from control unit 42 to close and tube 61 is disconnected from chamber 63 of bleeder block 52 and reconnected in position 61 to photoresist filled chamber 50 of block 52 via conduit 71. When pouch 100 has been emptied, a signal from weight monitor unit 64 causes control unit 42 to simultaneously close solenoid valve 38 and open solenoid valve 43 and pouch 200, in position 200, provides uninterrupted photoresist supply to pump 70. For subsequent pouch replacements, the procedure followed is to use only chamber 63 of block 52 for bleeding and disconnecting and reconnecting to chamber 50 for transmission of photoresist to pump 70. Thus, after the initial bleeding of a pouch using chamber 50, subsequent bleeding is accomplished using chamber 63, and primed, i.e., photoresist filled chamber 50, maintains the pumping system gas-free. Conduits 70, 77, 75 and 79 are all provided with conventional doubled ended shut off valve connectors of the type which remain closed until a tube is connected. The connecting tubes are also provided with conventional double ended quick disconnect connectors which remain closed until connected to the conduits. While the foregoing description has been directed to liquid photoresists and collapsible pouch type containers, the present invention may be used with other types of containers and with liquid chemicals generally.

What is claimed is:

1. A liquid chemical dispensing apparatus adapted to receive at least two collapsible pouches containing chemicals to be dispensed wherein each pouch has an outlet port, comprising
   (a) a liquid chemical pumping chamber having a lower outlet port adapted for the egress of liquid chemical from the pumping chamber and at least two higher inlet ports adapted for the ingress of liquid chemical to the pumping chamber;
   (b) a bleeder chamber having an inlet port adapted for the ingress of fluid and an outlet port adapted for the egress of fluid from the bleeder chamber, said outlet port being positioned to permit the egress of gases before the egress of liquids from the bleeder chamber;

(c) at least two conduits each being adapted at one end for connection and disconnection to the outlet port of a pouch and at the other end for fluid communication with separately and selectively each of an inlet port of the liquid chemical pumping chamber and an inlet port of the bleeder chamber, each of said conduits having a valve to open and close the conduit;

(d) a means for sensing when a pouch is empty and both (i) closing the valve in the conduit from the empty pouch to an inlet port in the pumping chamber and, (ii) opening the valve in the conduit from another pouch to another inlet port in the pumping chamber, whereby uninterrupted flow of liquid chemical to the pumping chamber can be provided by providing for fluid communication of a pouch through the conduit to an inlet port of the bleeder chamber for the purposes of removing gases contained in the pouch and then fluid communication of the pouch through the conduit to an inlet port of the pumping chamber for the purposes of providing liquid chemical thereto, wherein the valve in the conduit is adapted to be first open for fluid communication with the bleeder chamber for the purposes of removing gases contained in the pouch, then closed, reopened while the pouch is in communication with the pumping chamber upon the means for sensing ascertaining that another pouch that is in communication with the pumping chamber is empty, and closed when the means for sensing ascertains that the pouch is empty.

2. The apparatus of claim 1 wherein the conduit means is adapted to be manually connected and disconnected between each of an inlet port to the pumping chamber and inlet port to the bleeder chamber.

* * * * *

UNITED STATES PATENT AND TRADEMARK OFFICE
CERTIFICATE OF CORRECTION

PATENT NO. : 4,646,784
DATED : March 3, 1987
INVENTOR(S) : Marc de Leeuwe

It is certified that error appears in the above—identified patent and that said Letters Patent is hereby corrected as shown below:

In col. 1, line 41, the word "aperatures" should read -- apertures --; and line 44, the word "aperatures" should read -- apertures --.

In col. 2, line 43, the word "doubled" should read -- double --.

Signed and Sealed this

Eighth Day of September, 1987

*Attest:*

DONALD J. QUIGG

*Attesting Officer*     *Commissioner of Patents and Trademarks*